(12) United States Patent
Huang et al.

(10) Patent No.: US 9,101,072 B2
(45) Date of Patent: Aug. 4, 2015

(54) METHOD OF EMBEDDING MAGNETIC COMPONENT IN SUBSTRATE

(75) Inventors: Bo-Shiung Huang, New Taipei (TW); Han-Ching Shih, Guishan Township, Taoyuan County (TW); Tzu-Yuan Fan, Zhongli (TW); Wei-Hsiung Yang, Zhunan Township, Miaoli County (TW); Kai-Hsiang Chen, New Taipei (TW)

(73) Assignee: TRIPOD TECHNOLOGY CORPORATION, Ping-Jen (TW)

( * ) Notice: Subject to any disclaimer, the term of this patent is extended or adjusted under 35 U.S.C. 154(b) by 446 days.

(21) Appl. No.: 13/477,919

(22) Filed: May 22, 2012

(65) Prior Publication Data

US 2013/0104365 A1    May 2, 2013

(30) Foreign Application Priority Data

Oct. 31, 2011  (CN) .......................... 2011 1 0340404

(51) Int. Cl.
   *B23P 11/00*   (2006.01)
   *H05K 1/16*    (2006.01)
   *H01F 41/02*   (2006.01)
   *H01F 41/14*   (2006.01)

(52) U.S. Cl.
   CPC ............ *H05K 1/165* (2013.01); *H01F 41/0253* (2013.01); *H01F 41/14* (2013.01); *H05K 2201/086* (2013.01); *H05K 2201/09854* (2013.01); *Y10T 29/4902* (2015.01); *Y10T 29/49075* (2015.01); *Y10T 29/49826* (2015.01); *Y10T 29/49833* (2015.01)

(58) Field of Classification Search
   CPC ................... H05K 1/165; H05K 2201/09854; H05K 2201/086; H01F 41/14; H01F 41/0253; Y10T 29/4902; Y10T 29/49833; Y10T 29/49075
   USPC .......... 29/428, 432, 432.1, 829, 602.1, 592.1; 336/200, 192, 229, 232, 90, 92, 96; 174/266, 255; 156/293
   See application file for complete search history.

(56) References Cited

U.S. PATENT DOCUMENTS

| | | | |
|---|---|---|---|
| 2,127,260 A | * | 8/1938 | Kaiser .............................. 408/99 |
| 2010/0295646 A1 | | 11/2010 | Harrison et al. |
| 2011/0108317 A1 | | 5/2011 | Harrison et al. |
| 2011/0272094 A1 | * | 11/2011 | Dalmia et al. ................. 156/293 |

* cited by examiner

*Primary Examiner* — A. Dexter Tugbang
*Assistant Examiner* — Azm Parvez
(74) *Attorney, Agent, or Firm* — Stephen A. Becker, P.C.

(57) ABSTRACT

A method of embedding a magnetic component in a substrate is disclosed. Holes are formed in a substrate by mechanically drilling. Each of the holes includes a top opening, a bottom and sidewall, wherein an area of the top opening is larger than that of the bottom. The sidewall extends from the top opening vertically downwards to a predetermined depth, and then is slanted inwardly to the bottom to form a sloped sidewall at the bottom of the hole. A predetermined region is defined along a portion of an edge of the top opening, and a portion of the substrate material under the predetermined region is removed by routing to form a component accommodation trench with a portion of the sloped sidewall at the bottom. Then, a magnetic component is placed into the component accommodation trench.

5 Claims, 17 Drawing Sheets

METHOD OF EMBEDDING MAGNETIC COMPONENT IN SUBSTRATE

RELATED APPLICATIONS

This application claims priority to Chinese Application Serial Number 201110340404.1, filed Oct. 31, 2011, which is herein incorporated by reference.

BACKGROUND

1. Field of Invention

The present invention substantially relates to a method of embedding an electronic component such as a magnetic component in a substrate.

2. Description of Related Art

It is a mainstream in the development of the electronic industry to embed an electronic component into a printed circuit board for promoting space utilization. However, how to hold an embedding magnetic component in a printed circuit board is more difficult than that for embedding another type of electronic device in the printed circuit board. FIG. 1A to FIG. 1C are schematic cross-sectional views showing a conventional method of embedding a magnetic component. As shown in FIG. 1A, a recess 120 is firstly formed in a substrate 100. Referring to FIG. 1B, the magnetic component 135 is placed into the recess 120. Subsequently, the packaging adhesive 132 is filled in the recess 120 and covers the magnetic component 135. According to the wiring requirement, through holes 170 penetrating through the substrate 100 are formed at a predetermined position. Hence, the structure as shown in 1C is obtained. Then, through-hole plating is performed to fill conductive material in the holes.

With the shrinkage of the component size, the process efficiency of the embedded electronic components still needs further improvement.

SUMMARY

An aspect of the present invention is to provide a method of embedding a magnetic component in a substrate. In this method, two holes spaced at a certain distance are formed in the substrate by a first removing technique. Each of the two holes respectively includes a top opening, a bottom and a sidewall, wherein an area of the top opening is larger than that of the bottom. The sidewall extends from the top opening vertically downwards to a predetermined depth and then is slanted inwardly to the bottom to form a sloped sidewall at the bottom of the hole. Then, a portion of a substrate material between the two holes is removed to form a component accommodation trench by a second removing technique, such that a portion of the sidewall and a portion of the sloped sidewall of each of the two holes is reserved to be treated as a portion of the component accommodation trench. Thereafter, the magnetic component is placed into the component accommodation trench, wherein a removing rate of the second removing technique is greater than that of the first removing technique.

Another aspect of the present invention also is to provide a method of embedding a magnetic component in a substrate. In this method, an assembly hole formed from two partially overlapped holes is formed in the substrate by mechanically drilling. The assembly hole includes a top opening, a bottom opening and a sidewall, wherein an area of the top opening is larger than that of the bottom opening. The sidewall extends from the top opening downwards to a predetermined depth and then is slanted inwardly to the bottom opening to form a sloped sidewall at the bottom of the assembly hole. Then, a region is partially overlapped with the top opening of the assembly hole is defined. A portion of the substrate material under the region is removed, and a portion of the sloped sidewall and a portion of the sidewall of the assembly hole are reserved, so as to form a component accommodation trench with a bottom having a rim. Thereafter, the magnetic component is placed into the component accommodation trench.

Another aspect of the present invention is to provide a method of embedding a magnetic component in a substrate. In this method, a hole is formed in the substrate by a first removing technique. The hole includes a top opening, a bottom and a sidewall, wherein an area of the top opening is larger than that of the bottom. Each of the sidewall extends from the top opening downwards to a predetermined depth and then is slanted inwardly to the bottom to form a sloped sidewall at the bottom of the hole. Then, a region partially overlapped with the top opening of the hole is defined. A portion of the substrate material under the region is removed by a second removing technique, so as to form a component accommodation trench, wherein a portion of the sloped sidewall of the hole is reserved at the bottom of the component accommodation trench. Thereafter, the magnetic component is placed into the component accommodation trench, wherein a removing rate of the second removing technique is greater than the removing rate of the first removing technique.

Since the formed component accommodation trench has the sloped sidewall, the magnetic component may be embedded at a predetermined depth in the substrate without using an adhesive substance. On the other hand, after the magnetic component is placed in, the magnetic component resists against the sidewall of the component accommodation trench but is spaced at a certain distance from the bottom, thereby holding the embedded magnetic component by the substrate.

BRIEF DESCRIPTION OF THE DRAWINGS

The invention can be more fully understood by reading the following detailed description of the embodiment, with reference made to the accompanying drawings as follows:

FIG. 2A to 5A and FIG. 2B to 5B are top views and cross-sectional views showing a method of embedding a magnetic component according to a first embodiment of the present invention;

FIG. 2A' to 5A' and FIG. 2B' to 5B' are top views and cross-sectional views showing a method of embedding a magnetic component according to a second embodiment of the present invention;

FIG. 6A to 9A and FIG. 6B to 9B are top views and cross-sectional views showing a method of embedding a magnetic component according to a third embodiment of the present invention; and FIG. 10A to 13A and FIG. 10B to 13B are top views and cross-sectional views showing a method of embedding a magnetic component according to a fourth embodiment of the present invention.

DETAILED DESCRIPTION

To make the above and other objectives, characteristics and advantages more apparent and easy to understand, the present invention will be described in the following embodiments with reference to the accompanying drawing, but these embodiments are not intended to limit the present invention.

Any component with equivalent functions that is produced from a structure formed by recombination of elements shall fall within the scope of the present invention. The drawings are only illustrative and are not made according to the actual size. For example, the hole generally is round but is oval in some drawings.

FIG. 2A, FIG. 3A, FIG. 4A and FIG. 5A are top views showing a method of embedding a magnetic component according to a first embodiment of the present invention, wherein FIG. 2B, FIG. 3B, FIG. 4B and FIG. 5B are cross-sectional views viewed along respective dash lines I-I' in FIG. 2A, FIG. 3A, FIG. 4A and FIG. 5A.

Figure 1A:
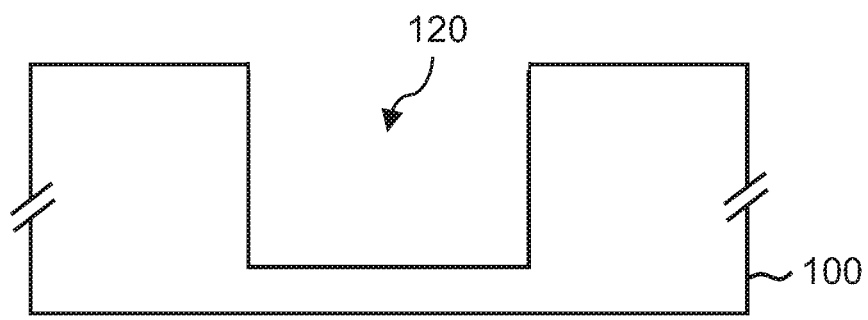
FIG. 1 A to FIG. 1C are schematic cross-sectional views showing a method of embedding a magnetic component according to the prior art.
Figure 1B:
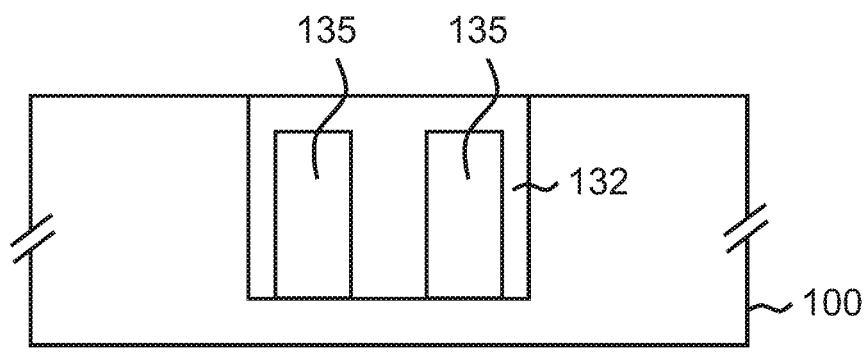
Figure 1C:
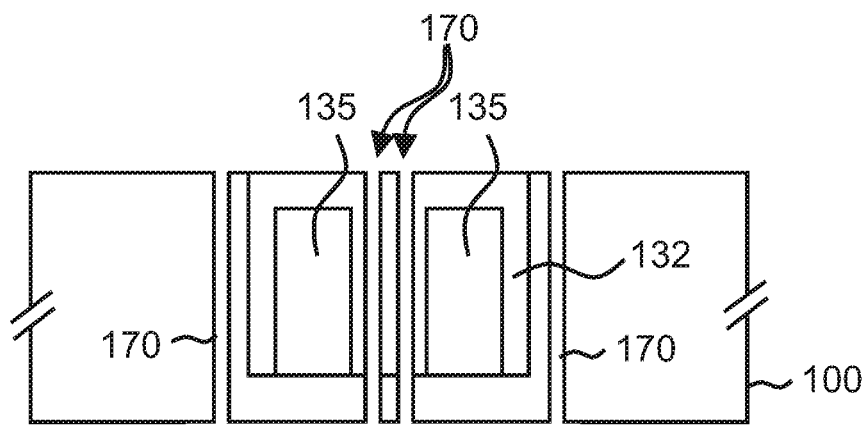
Figure 2A:
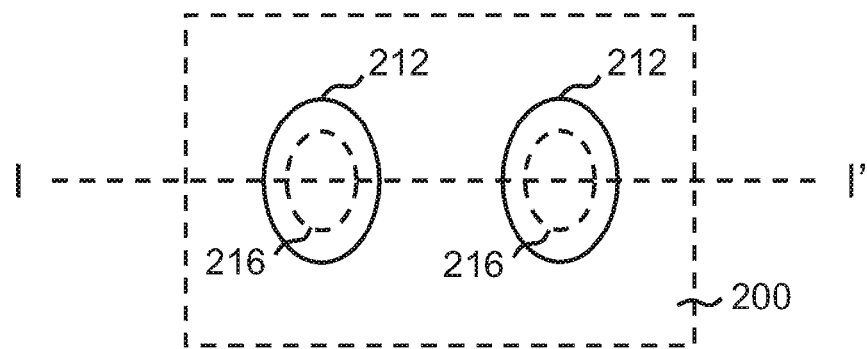
Figure 2B:
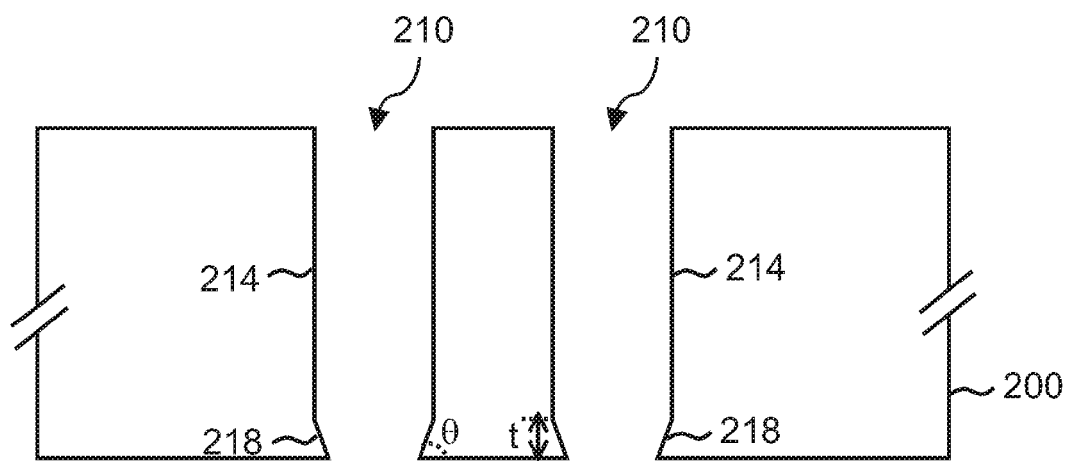
Figure 2A:
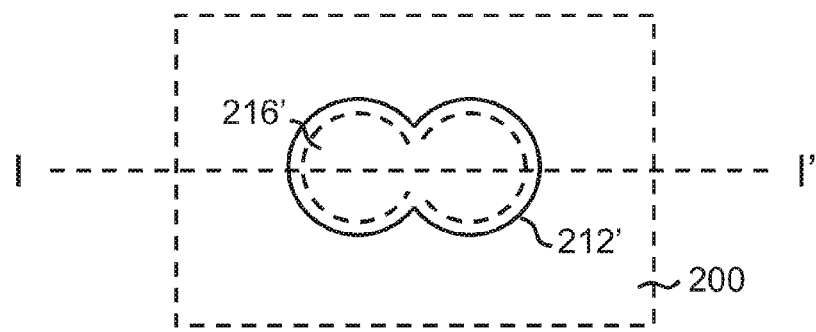
Figure 2B:
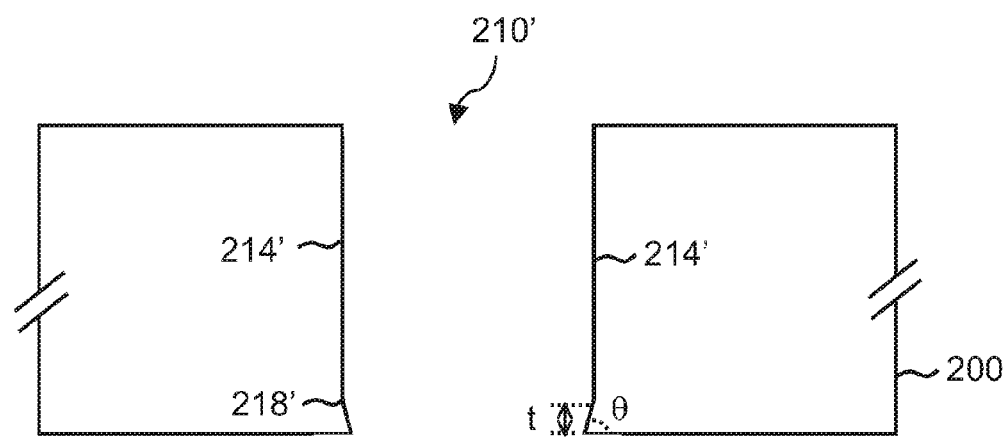

Referring to FIG. 2A and FIG. 2B, two holes 210 spaced at a certain distance are formed in a substrate 200 by mechanically drilling. The interval and depths of the two holes 210 are determined in accordance with the size and position of an embedded device. The area of a top opening 212 of each hole 210 is larger than the area of a bottom opening 216. A sidewall 214 extends from the top opening 212 vertically downwards to a predetermined depth and then is slanted inwardly to the bottom opening 216 to form a sloped sidewall 218 at the bottom of each hole 210. The substrate 200 may be an electroplated insulation substrate that covers the overlying or underlying conductive layers and is such as but not limited to an epoxy-resin-fiberglass (FR4). By selecting the shape of the drilling head and controlling the drilling depth in the mechanically drilling process, the angle θ and the thickness t for forming the sloped sidewall 218 can be determined.

Subsequently, referring to FIG. 3A and FIG. 3B, a region 224 is partially overlapped with the top openings 212 (FIG. 2A) of the two holes 210, and the material of the substrate 200 under the region 224 is removed, so as to form a component accommodation trench 220. The region 224 removed at least includes the portion between the two holes 210, such that the two holes 210 are connected to each other so as to form the component accommodation trench 220. The removing depth while forming the component accommodation trench 220 is not particularly limited as long as the final accommodation trench structure has a portion of the sloped sidewall 218 that is not removed and a portion of the sidewall 214 of the holes 210 that is not removed. The structure may serve as a holding structure of the magnetic component. The removing method may adopt a routing, punching or any other suitable technique for quickly removing a portion of the substrate material as compared with the mechanically drilling technique.

The portions of the sidewalls 214 of the two holes 210 are remained in the component accommodation trench 220. Preferably, portions of the sidewalls 214 of the two holes 210 form two opposing sidewalls of the component accommodation trench 220. The two opposing sidewalls extend vertically downwards to a predetermined depth, and then are slanted inwardly to the bottom opening of the component accommodation trench 220, such that portions of the sloped sidewalls 218 of the two holes 210 are reserved at the bottom of the component accommodation trench 220 to form a rim 226 served as a holding structure of the magnetic component. The structure for holding the magnetic component was described in U.S. patent application Ser. No. 13/028,949, which is entitled "Planar electronic device having a magnetic component and method for manufacturing the electronic device", which is hereby incorporated by reference in its entirety.

Figure 4A:
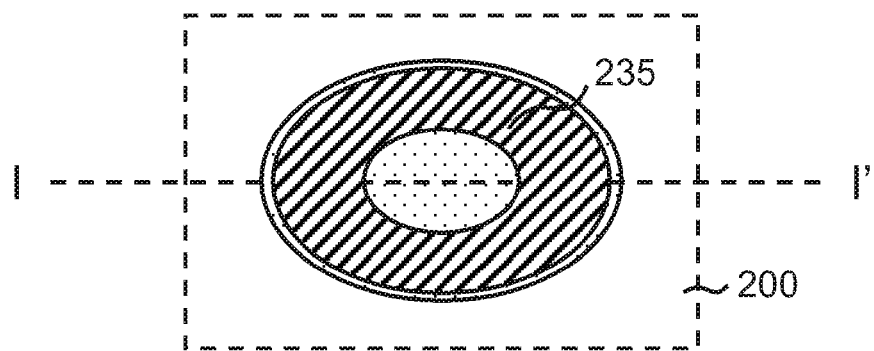
Figure 4B:
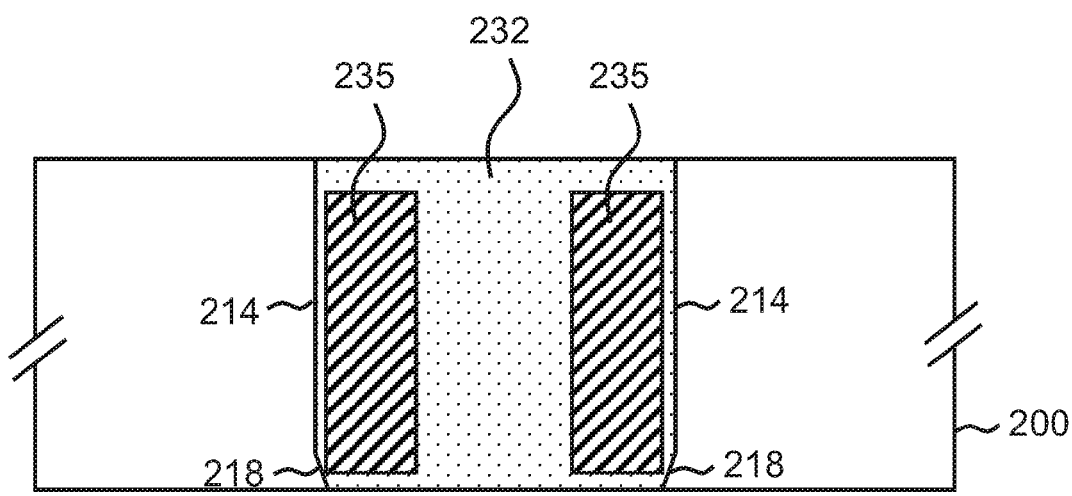
Figure 4A:
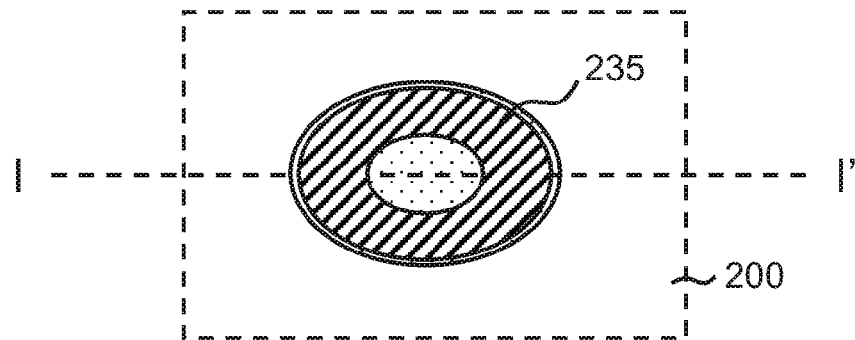
Figure 4B:
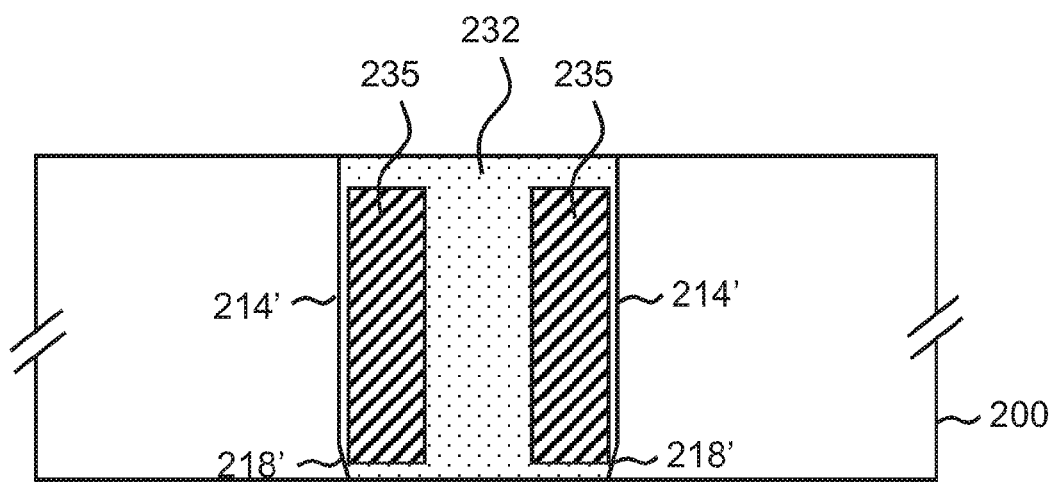

Referring to FIG. 4A and FIG. 4B, a ring type magnetic component 235 is placed into the component accommodation trench 220 by a SMT (Surface Mounting Technology). Then, an adhesive substance 232 is filled for fixing. The SMT allows the magnetic component 235 to be firstly adhered to the adhesive substance 232 and then the magnetic component 235 is placed into the component accommodation trench 220 to be adhered thereto. Or, the adhesive substance 232 is firstly filled in the component accommodation trench 220, and then the magnetic component 235 placed into the component accommodation trench 220 is fixed. The magnetic component 235 may be any magnetic material that is suitable for an electromagnetic component, for example, a ferrite core.

As shown in FIG. 4B, after the magnetic component 235 is placed in, the magnetic component 235 resists against the sloped sidewall 218 of the component accommodation trench 220 and/or resists against a portion of the sidewall 214 of the component accommodation trench 220 but is spaced at a certain distance from the bottom opening.

In another embodiment, since the component accommodation trench 220 has the sloped sidewall 218 for holding the magnetic component 235, the magnetic component 235 may be embedded at a predetermined depth in the substrate without using the adhesive substance 232. In this situation, the component accommodation trench 220 is filled up with gas.

Figure 5A:
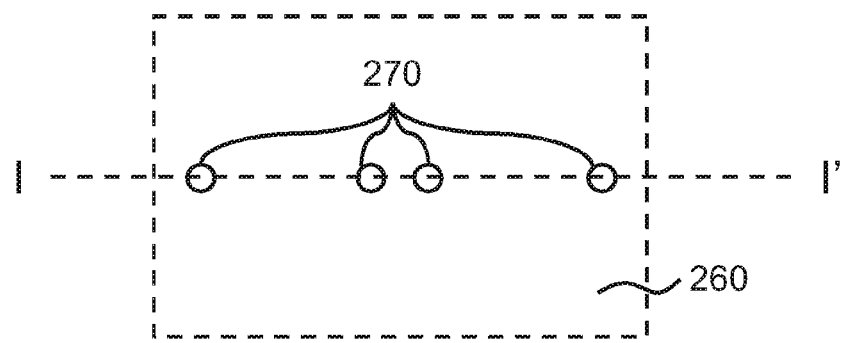
Figure 5B:
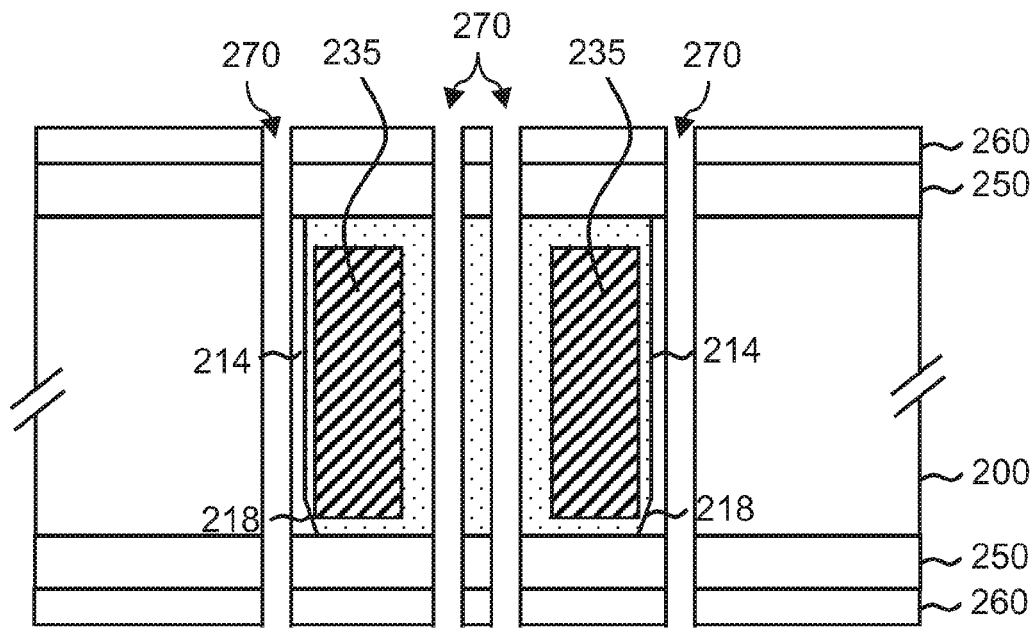
Figure 5A:
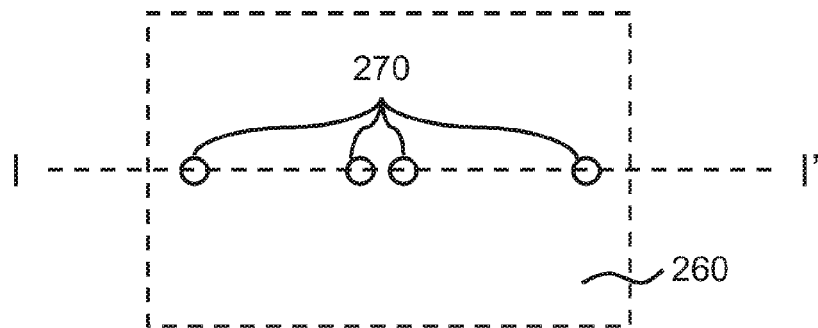
Figure 5B:
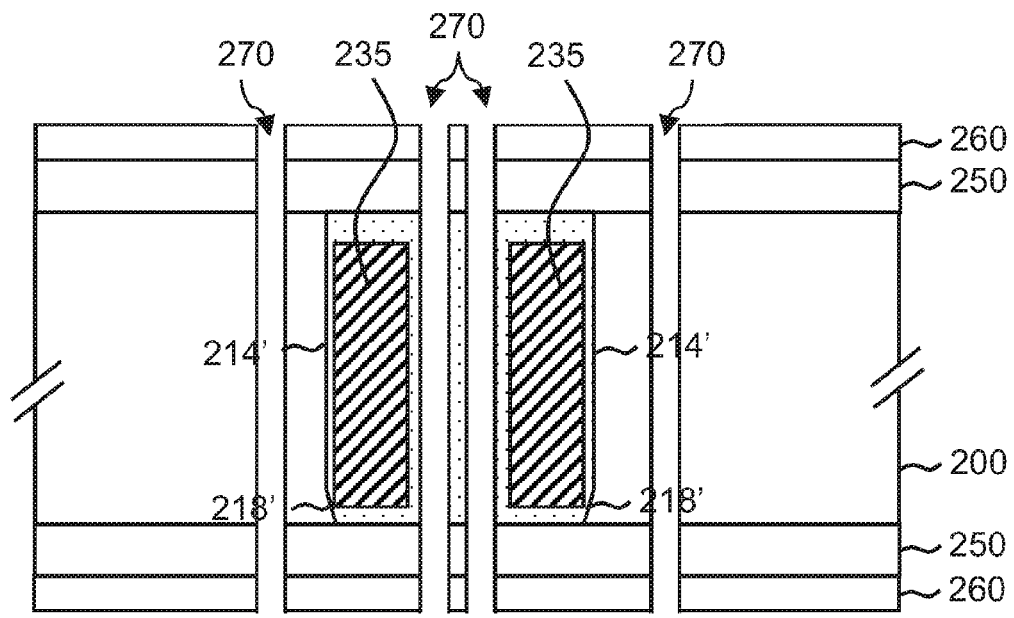

Referring to FIG. 5A and FIG. 5B, a dielectric layer 250 and a conductive layer 260 are sequentially formed on the upper and lower sides of the substrate 200. The dielectric layer 250 may be poly(propylene) or bondply or any other insulation material composed of organic material. The conductive layer 260 is such as a copper foil or any other suitable conductive material film. In an embodiment, the bondply serves as the dielectric layer, and the copper foil is adhered to the substrate through the bondply by laminating. Subsequently, processes including drilling, desmearing, smear-removing and through-hole plating are performed to form vias 270 penetrating through the substrate 200, the dielectric layer 250 and the conductive layer 260 at the predetermined position. Thereafter, the conductive layer 260 is patterned by image transfer and etching to form a conductive wiring (not shown). The arrangement positions and number of the vias in the drawings are merely illustrative and are not intended to limit the scope of the present invention. The method of embedding a magnetic component was described in U.S. patent application Ser. No. 12/592,771, which is entitled "Manufacture and use of planar embedded magnetics as discrete components and in integrated connectors", which is hereby incorporated by reference in its entirety.

Figure 3A:
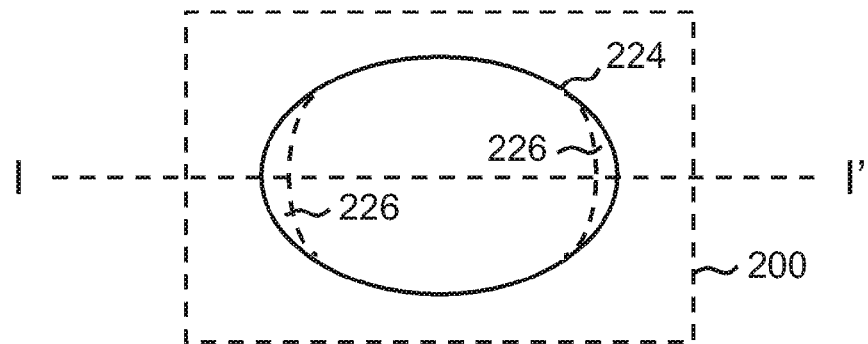
Figure 3B:
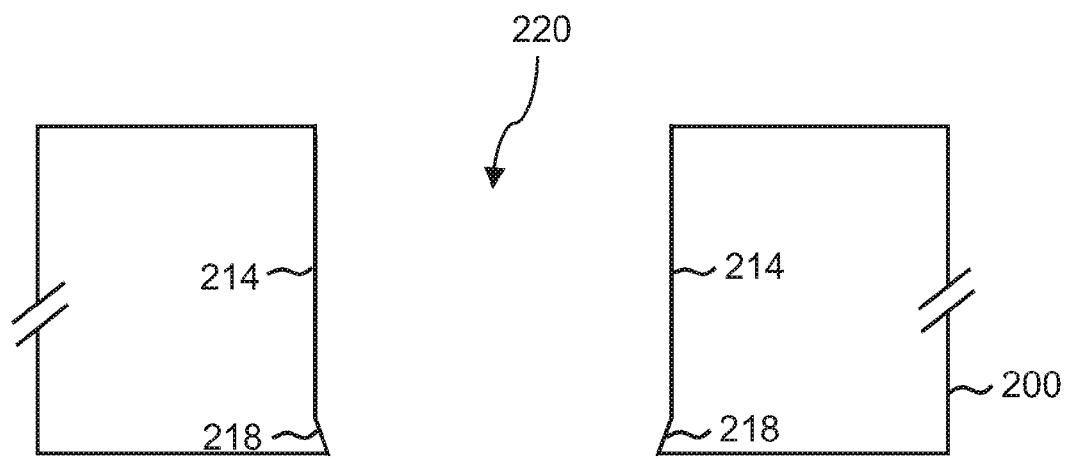
Figure 3A:
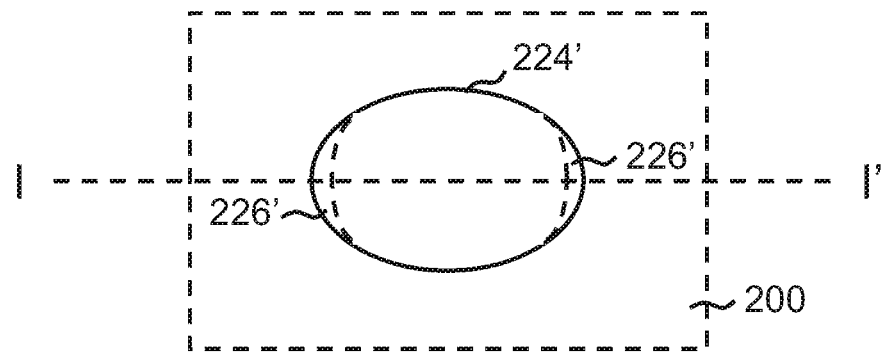
Figure 3B:
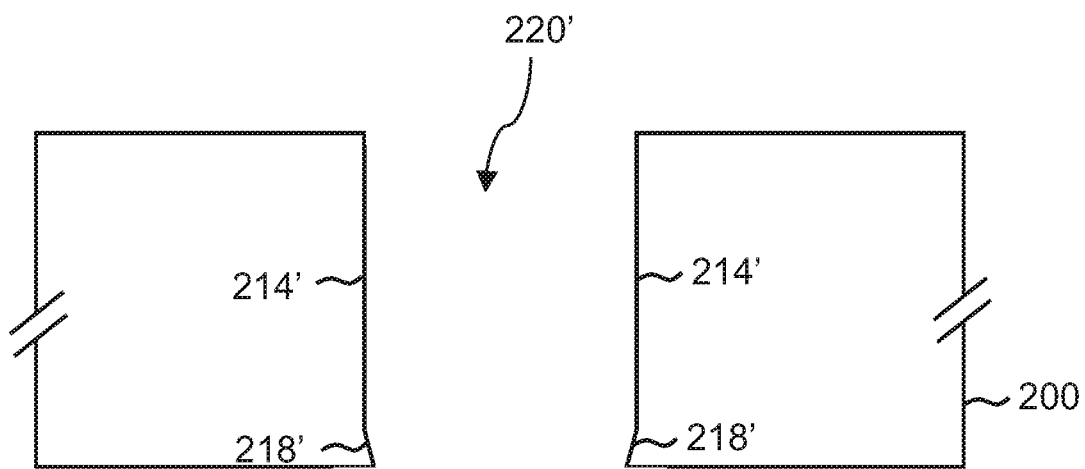

FIG. 2A', FIG. 3A', FIG. 4A' and FIG. 5A' are top views showing a method of embedding a magnetic component according to a second embodiment of the present invention, wherein FIG. 2B', FIG. 3B', FIG. 4B' and FIG. 5B' are cross-sectional views viewed along respective dash lines I-I' in FIG. 2A', FIG. 3A', FIG. 4A' and FIG. 5A'.

Referring to FIG. 2A' and FIG. 2B', two partially overlapped holes are formed in the substrate 200 by mechanically drilling to form an assembly hole 210'. The extent of overlapping and the depth of the two holes are determined in accordance with the size and position of an embedded device. The area of the top opening 212' of the assembly hole 210' is larger than the area of the bottom opening 216'. The sidewall 214' extends from the top opening 212' vertically downwards to a predetermined depth and then is slanted inwardly to the bottom opening 216' to form a sloped sidewall 218' at the bottom of the assembly hole 210'. The substrate 200 may be an electroplated insulation substrate that covers the overlying and underlying conductive layers, and is such as but not limited to the epoxy-resin-fiberglass (FR4). By selecting the shape of the drilling head and controlling the drilling depth in the mechanically drilling process, the angle θ and the thickness t of forming the sloped sidewall 218' can be determined.

Subsequently, referring to FIG. 3A' and FIG. 3B', a region 224' is partially overlapped with the top openings 212' (FIG.

2A') of the assembly hole 210', and the material of the substrate 200 under the region 224' is removed, so as to form a component accommodation trench 220'. The removing depth while forming the component accommodation trench 220' is not particularly limited as long as the final accommodation trench structure has a portion of the sloped sidewall 218' that is not removed and a portion of the sidewall 214' of the assembly holes 210' that is not removed. The structure may serve as a holding structure of the magnetic component. The removing method may adopt routing, punching or any other suitable technique for quickly removing a portion of the substrate material as compared with the mechanically drilling technique. The portions of the sidewalls 214' of the hole 210' are remained in the component accommodation trench 220'. Preferably, portions of the sidewall 214' of the hole 210' form two opposing sidewalls of the component accommodation trench 220'. The two opposing sidewalls extend vertically downwards to a predetermined depth, and then are slanted inwardly to the bottom opening of the component accommodation trench 220', such that a portion of the sloped sidewall 218' of the hole 210' is reserved at the bottom of the component accommodation trench 220' to form a rim 226' served as holding structures of the magnetic component.

Referring to FIG. 4A' and FIG. 4B', the ring type magnetic component 235 is placed into the component accommodation trench 220 by the SMT. Then, an adhesive substance 232 is filled for fixing. The SMT allows the magnetic component 235 to be firstly adhered to the adhesive substance 232 and then the magnetic component 235 is placed into the component accommodation trench 220 to be adhered thereto. Or, the adhesive substance 232 is firstly filled in the component accommodation trench 220, and then the magnetic component 235 placed into the component accommodation trench 220 is fixed. The magnetic component 235 may be any magnetic material that is suitable for an electromagnetic component, for example, a ferrite core.

As shown in FIG. 4B', after the magnetic component 235 is placed in, the magnetic component 235 resists against the sloped sidewall 218' of the component accommodation trench 220' and/or resists against a portion of the sidewall 214' of the component accommodation trench 220' but is spaced at a certain distance from the bottom opening.

In another embodiment, since the component accommodation trench 220' has the sloped sidewall 218' for holding the magnetic component 235, the magnetic component 235 may be embedded at a predetermined depth in the substrate without using the adhesive substance 232. In this situation, the component accommodation trench 220' is filled up with a gas.

Referring to FIG. 5A' and FIG. 5B', the dielectric layer 250 and the conductive layer 260 are sequentially formed on the upper and lower sides of the substrate 200. The dielectric layer 250 may be poly(propylene) or bondply or any other insulation materials composed of organic matters. The conductive layer 260 is such as a copper foil or any other suitable conductive material film. In an embodiment, the bondply serves as the dielectric layer, and the copper foil is adhered to the substrate through the bondply by laminating. Subsequently, processes including drilling, desmearing, smear-removing and through-hole plating are performed to form vias 270 penetrating the substrate 200, the dielectric layer 250 and the conductive layer 260 at the predetermined position. Thereafter, the conductive layer 260 is patterned by image transfer and etching to form a conductive wiring (not shown). The arrangement position and number of the vias in the drawings are only illustrative and are not intended to limit the scope of the present invention.

Figure 6A:
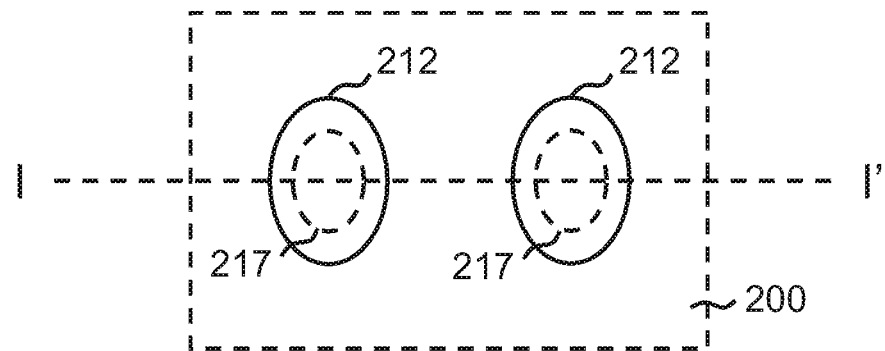
Figure 7A:
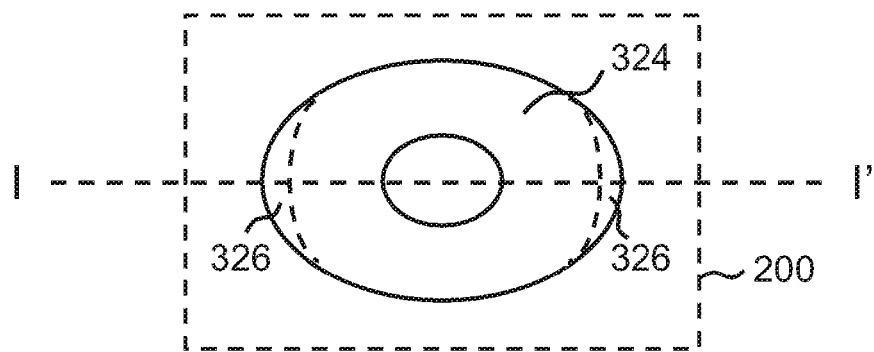
Figure 7B:
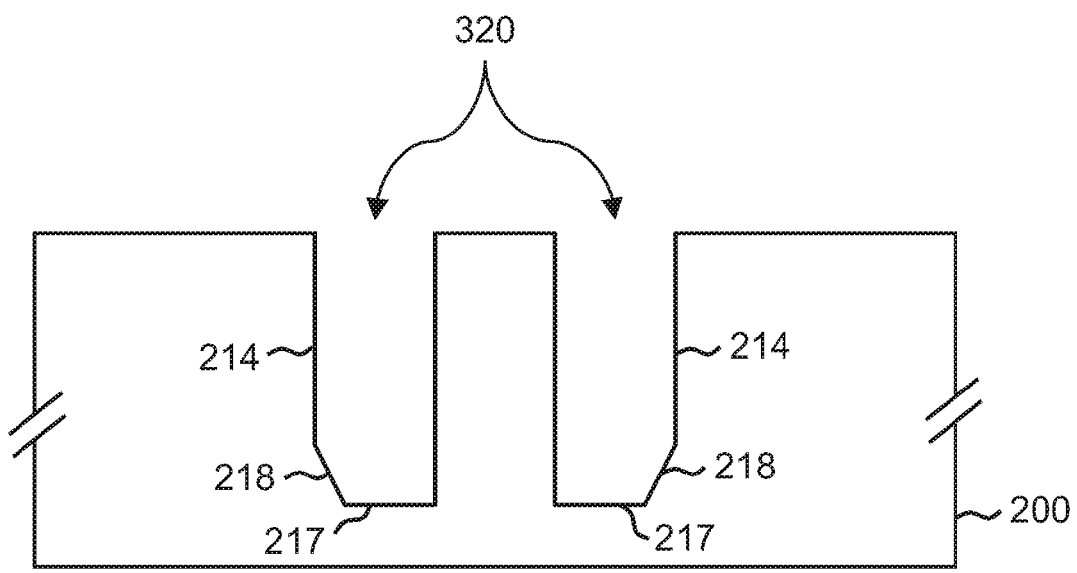
Figure 8A:
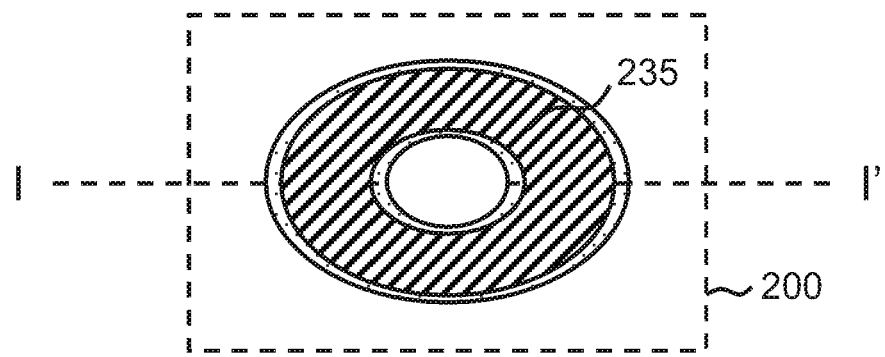
Figure 8B:
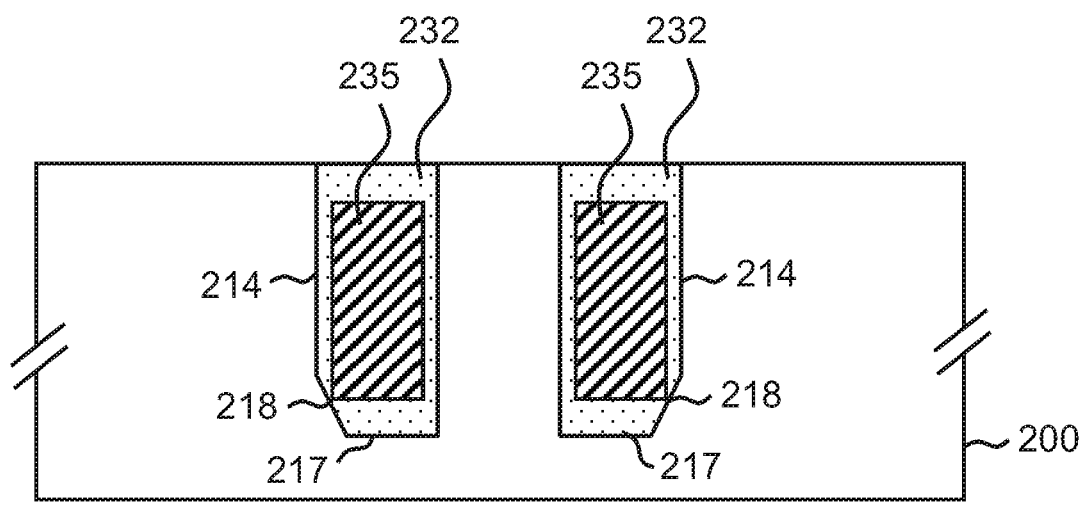
Figure 9A:
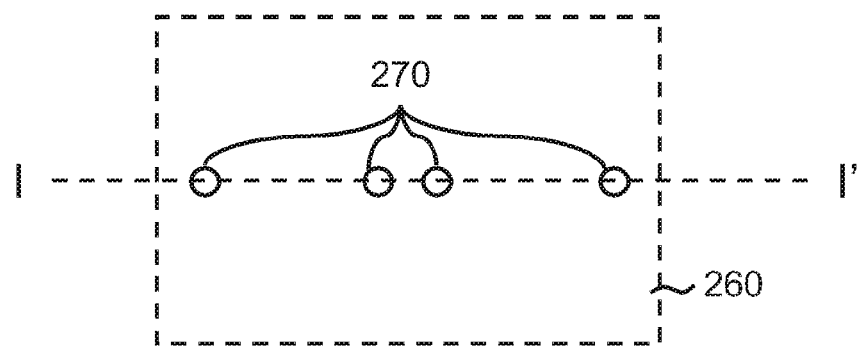

FIG. 6A FIG. 7A, FIG. 8A and FIG. 9A are top views showing a method of embedding a magnetic component according to a third embodiment of the present invention, wherein FIG. 6B, FIG. 7B, FIG. 8B and FIG. 9B are cross-sectional views viewed along respectively dash lines I-I' in FIG. 6A, to FIG. 9A.

Figure 6B:
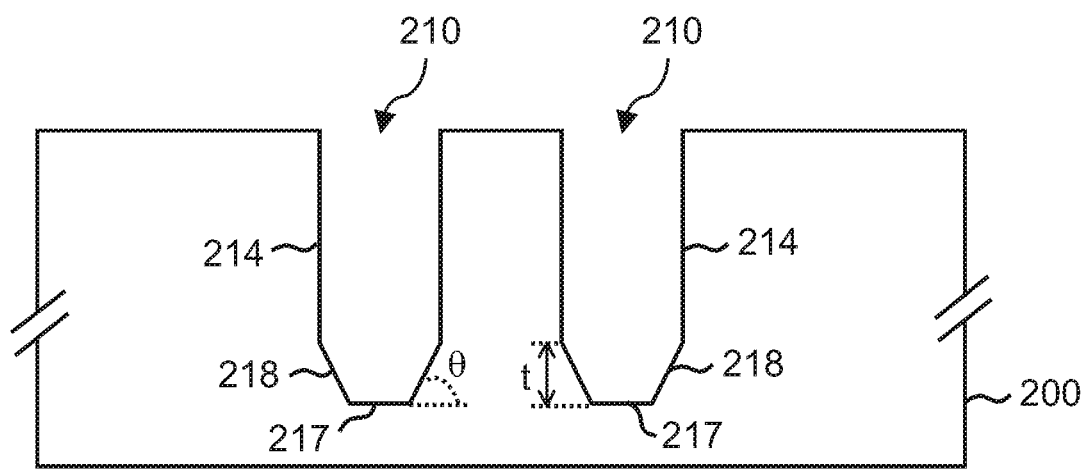

Referring to FIG. 6A and FIG. 6B, two holes 210 spaced at a certain distance are formed in the substrate 200 by mechanically drilling. The interval and depths of the two holes 210 are determined depending on the size and position of an embedded device. The area of the top opening 212 of the hole 210 is larger than the area of the bottom 217. The sidewall 214 extends from the top opening 212 vertically downwards to a predetermined depth and then is slanted inwardly to the bottom 217 to form a sloped sidewall 218 at the bottom of the hole 210. The substrate 200 may be an electroplated insulation substrate that covers the overlying and underlying conductive layers, and is for example but not limited to the epoxy-resin-fiberglass (FR4). By selecting the shape of the drilling head and controlling the drilling depth in the mechanically drilling process, the angle θ and the thickness t of forming the sloped sidewall 218 can be determined.

Subsequently, referring to FIG. 7A and FIG. 7B, a ring type region 324 is partially overlapped with the top openings 212 (FIG. 6A) of the two holes 210, and the material of the substrate 200 under the region 324 is removed, so as to form a ring type component accommodation trench 320. The removing depth while forming the component accommodation trench 320 is not particularly limited as long as the final accommodation trench structure has a portion of the sloped sidewall 218 that is not removed and a portion of the sidewall 214 of the holes 210 that is not removed. The structure may serve as a holding structure of the magnetic component. The removing method may adopt routing, punching or any other suitable techniques for quickly removing a portion of the substrate material as compared with the mechanically drilling technique. The portions of the sidewalls 214 of the two holes 210 are remained in the component accommodation trench 320. Preferably, portions of the sidewalls 214 of the two holes 210 constitute a portion of ring type sidewall of the component accommodation trench 320. The sidewalls 214 extends vertically downwards to a predetermined depth, and then are slanted inwardly to the bottom of the component accommodation trench 320, such that a portion of the sloped sidewalls 218 of the two holes 210 are reserved at the bottom of the component accommodation trench 320 to constitute a rim 326 served as holding structures of the magnetic component.

Referring to FIG. 8A and FIG. 8B, a ring type magnetic component 235 is placed into the component accommodation trench 320 by the SMT. Then, an adhesive substance 232 is filled for fixing. The SMT allows the magnetic component 235 is firstly adhered to the adhesive substance 232 and then the magnetic component 235 is placed into the component accommodation trench 320 to be adhered there. Or, the adhesive substance 232 is firstly filled in the component accommodation trench 320, and then the magnetic component 235 placed into the component accommodation trench 320 is fixed. The magnetic component 235 may be any magnetic material that is suitable for an electromagnetic component, for example, a ferrite core.

As shown in FIG. 8B, after the ring type magnetic component 235 is placed in, the magnetic component 235 resists against the sloped sidewall 218 of the component accommodation trench 320 and/or resists against a portion of the sidewall 214 of the component accommodation trench 320 but is at a certain distance from the bottom 217.

In another embodiment, since the component accommodation trench 320 has the sloped sidewall 218 for holding the magnetic component 235, the magnetic component 235 may be embedded at a predetermined depth in the substrate without using the adhesive substance 232. In this situation, the component accommodation trench 320 is filled up with a gas.

Figure 9B:
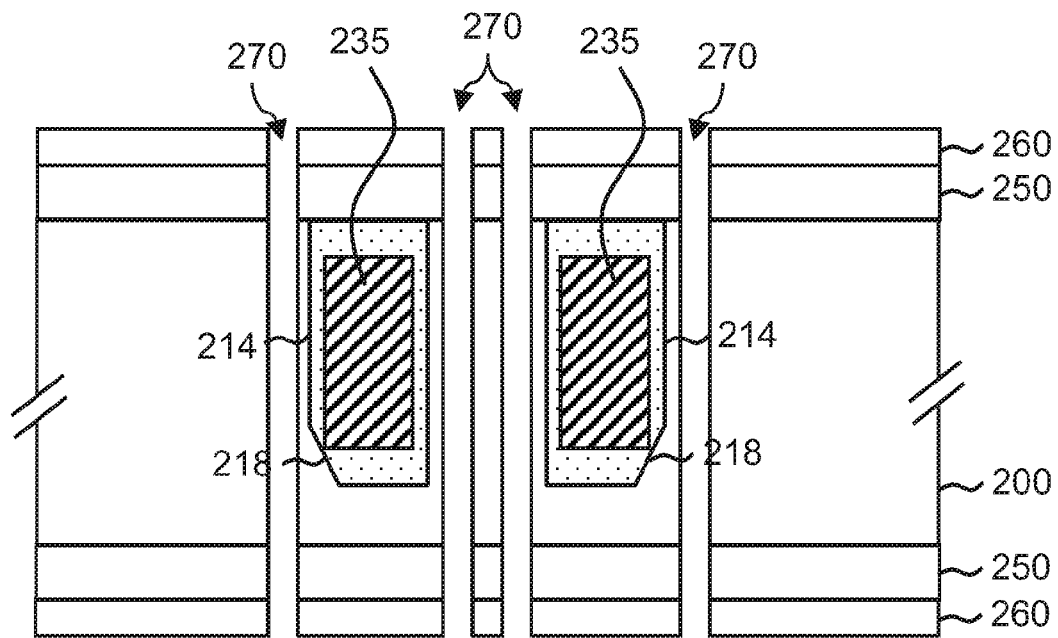

Referring to FIG. 9A and FIG. 9B, the dielectric layer 250 and the conductive layer 260 are sequentially formed on the upper and lower sides of the substrate 200. The dielectric layer 250 may be poly(propylene) or bondply or any other insulation materials composed of organic matters. The conductive layer 260 is for example a copper foil or any other suitable conductive material film. In an embodiment, the bondply serves as the dielectric layer, and the copper foil is adhered to the substrate through the bondply by laminating. Subsequently, processes including drilling, desmearing, smear-removing and through-hole plating are performed to, form vias 270 penetrating through the substrate 200, the dielectric layer 250 and the conductive layer 260 at the predetermined position. Thereafter, the conductive layer 260 is patterned by image transfer and etching to form a conductive wiring (not shown). The arrangement position and number of the vias in the drawings are merely illustrative and are not intended to limit the scope of the present invention.

FIG. 10A, FIG. 11A, FIG. 12A and FIG. 13A are top views of processes of a method of embedding a magnetic component according to a fourth embodiment of the present invention, wherein FIG. 10B, FIG. 11B, FIGS. 12B and 13B are cross-sectional views viewed along respectively dash lines I-I' in FIG. 10A to FIG. 13A.

Figure 10A:
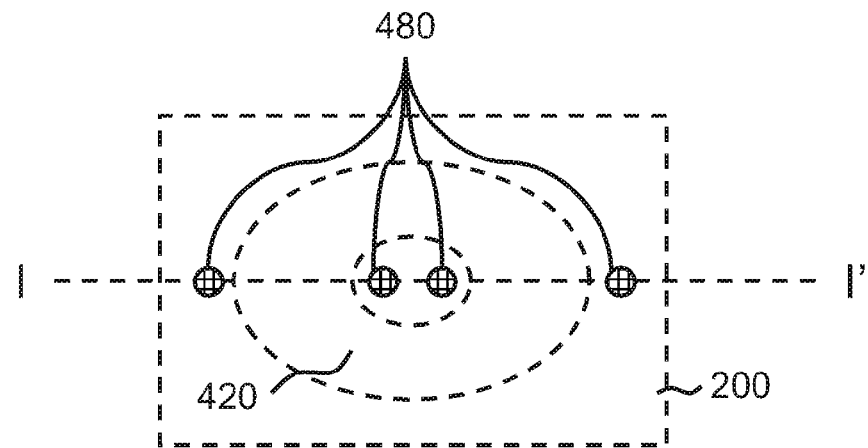
Figure 10B:
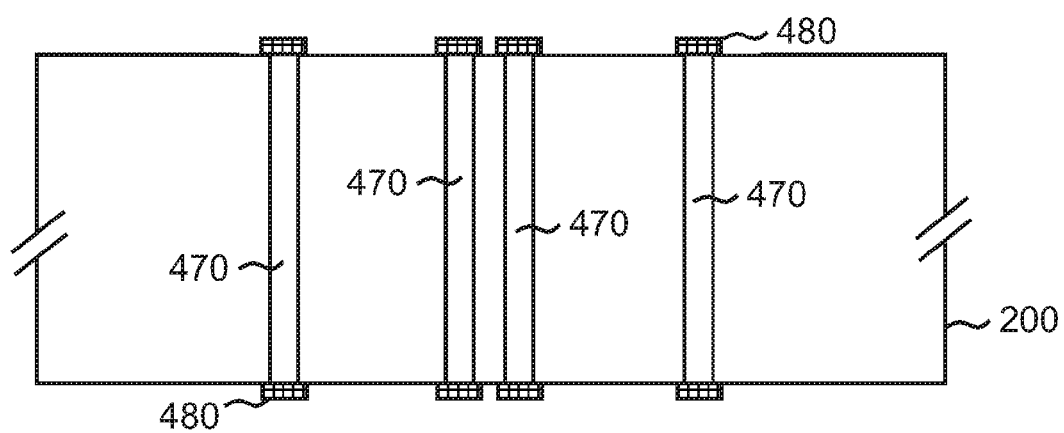

Referring to FIG. 10A and FIG. 10B, the electroplated insulation substrate 200 that covers the conductive layer from above and below is for example the epoxy-resin-fiberglass (FR4). The location for embedding the magnetic component is defined on the substrate 200. Herein, the ring type component accommodation trench 420 (between two dash lines) is taken as an example. Thereafter, processes including drilling, desmearing, smear-removing and through-hole plating are performed to form vias 470 penetrating the substrate 200 at a predetermined position. Subsequently, the upper and lower conductive layers of the substrate 200 are patterned by image transfer and etching to form cap pads 480 that cover the vias 470.

Figure 11A:
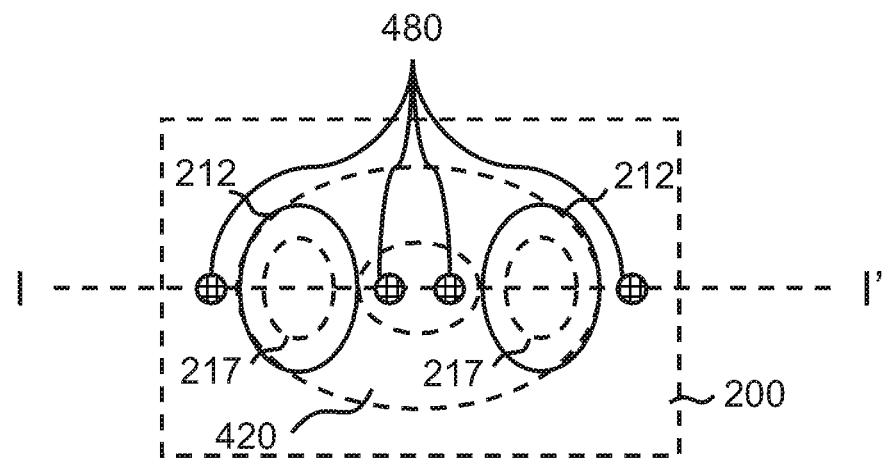
Figure 11B:
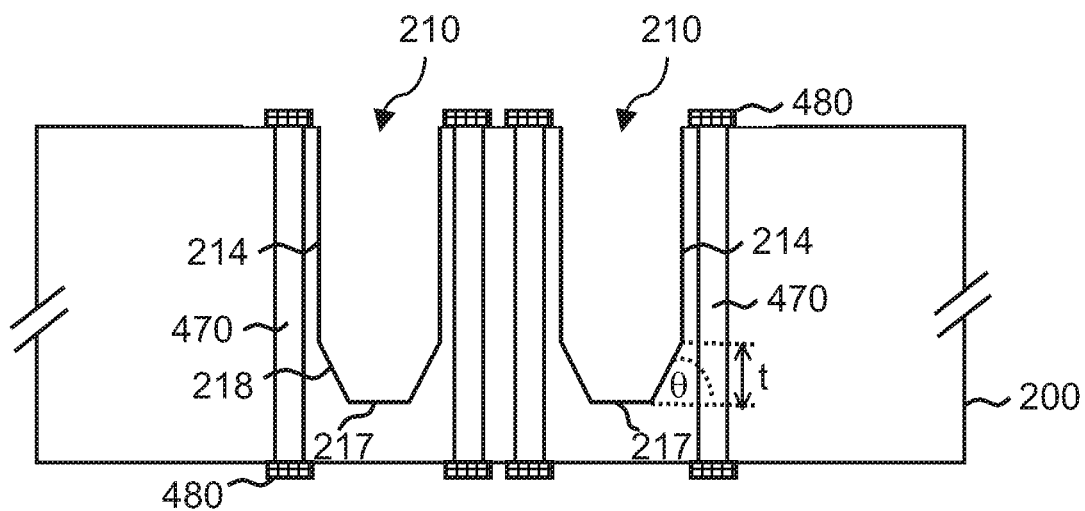

Referring to FIG. 11A and FIG. 11B, two holes 210 are formed by mechanically drilling at two opposing positions in the ring type component accommodation trench 420. The depths of the two holes 210 are determined depending on the size and position of an embedded device. The area of the top opening 212 of the hole 210 is larger than the area of the bottom 217. The sidewall 214 extends from the top opening 212 vertically downwards to a predetermined depth and then is slanted inwardly to the bottom 217 so as to form a sloped sidewall 218 at the bottom of the hole 210. By selecting the shape of the drilling head and controlling the drilling depth in the mechanically drilling process, the angle θ and the thickness t of forming the sloped sidewall 218 can be determined.

Figure 12A:
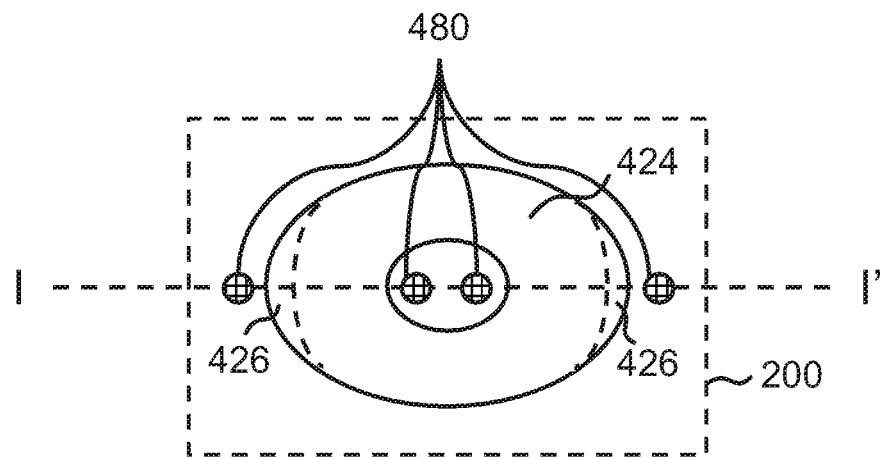
Figure 12B:
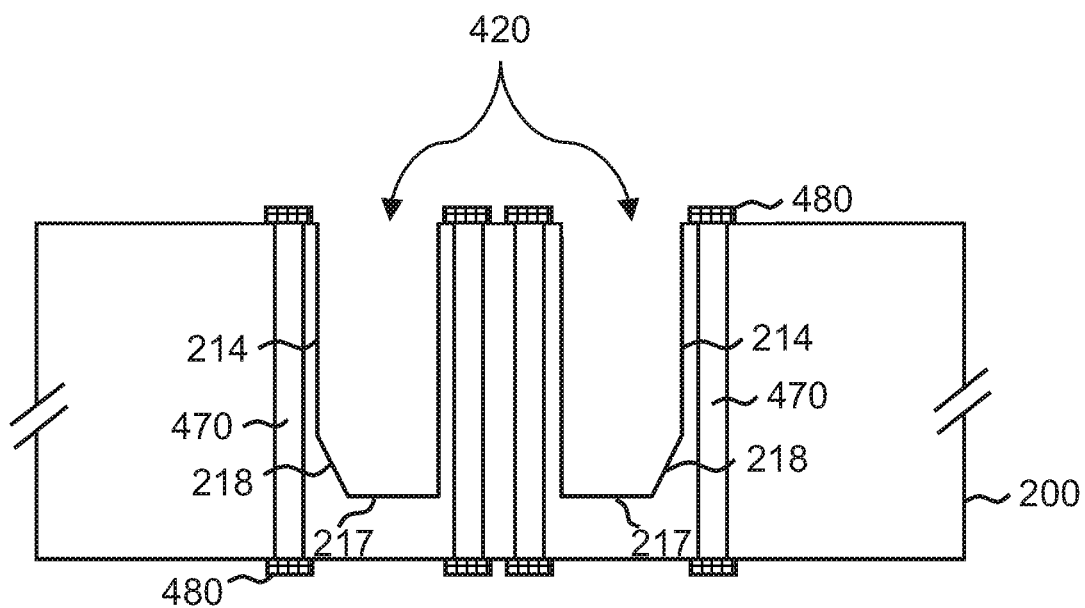

Subsequently, referring to FIG. 12A and FIG. 12B, the material of the substrate 200 under a region 424 is removed to form a ring type component accommodation trench 420. The removed depth is not particularly restricted as long as the final accommodation trench structure contains a portion of the sloped sidewall 218 that is not removed and a portion of the sidewall 214 of the holes 210 that is not removed. The structure may serve as a holding structure of the magnetic component. The removing method may adopt a routing, punching or any suitable technique for quickly removing a portion of the substrate material as compared with the mechanically drilling technique. The portions of the sidewalls 214 of the two holes 210 are remained in the component accommodation trench 220. Preferably, portion of the sidewall 214 of each of the two holes 210 form a portion of the ring type sidewall of the component accommodation trench 420. The sidewalls 214 extend vertically downwards to a predetermined depth and then are slanted inwardly to the bottom of the component accommodation trench 420, such that portions of the sloped sidewalls 218 of the two holes 210 are reserved at the bottom of the component accommodation trench 420 to form a rim 426 served as holding structures of the magnetic component.

Figure 13A:
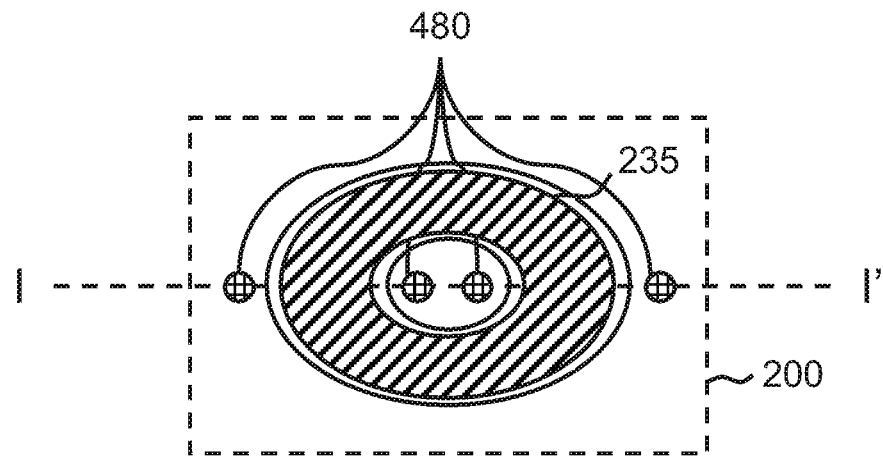
Figure 13B:
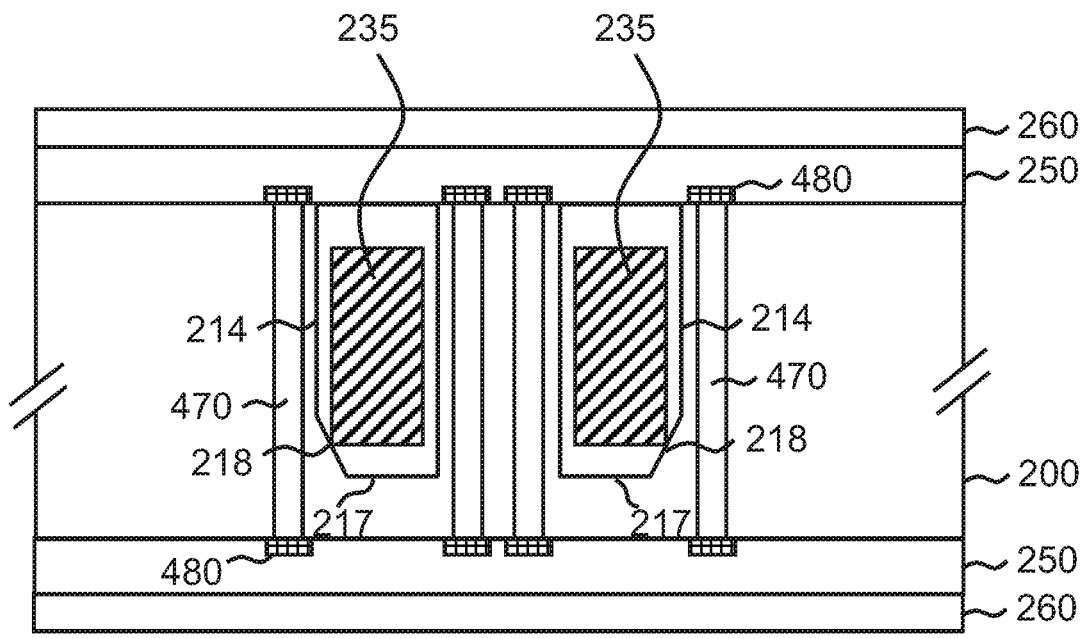

Referring to FIG. 13A and FIG. 13B, the ring type magnetic component 235 is placed into the component accommodation trench 420. The magnetic component 235 may be any magnetic material that is suitable for an electromagnetic component, for example, a ferrite core. Since the component accommodation trench 420 has the sloped sidewall 218 and the sidewall 214 for holding the magnetic component 235, after the ring type magnetic component 235 is placed in, the magnetic component 235 resists against the sloped sidewall 218 of the component accommodation trench 420 and/or resists against a portion of the sidewall 214 of the component accommodation trench 320 but is at a certain distance from the bottom 217. As shown in FIG. 13B, now, the component accommodation trench 420 is filled up with a gas.

In another embodiment, the ring type magnetic component 235 may be placed into the component accommodation trench 420 by the SMT. Then, an adhesive substance is filled for fixing. Or, the magnetic component 235 is firstly adhered to the adhesive substance and then the magnetic component 235 is placed into the component accommodation trench 420 to be adhered there. Or, the adhesive substance is firstly filled in the component accommodation trench 420, and then the magnetic component 235 placed into the component accommodation trench 420 is fixed.

Referring to FIG. 13A and FIG. 13B, the dielectric layer 250 and the conductive layer 260 are sequentially formed on the upper and lower sides of the substrate 200. The dielectric layer 250 may be poly(propylene) or bondply or any other insulation materials composed of organic matters. The conductive layer 260 is such as a copper foil or any other suitable conductive material film. In an embodiment, the bondply serves as the dielectric layer, and the copper foil is adhered to the substrate through the bondply by laminating. Thereafter, through holes (not shown) for coupling the vias 470 through the cap pads 480 are formed at the predetermined position. Then, the conductive layer 260 is patterned by image transfer and etching to form a conductive wiring (not shown). The arrangement positions and number of the vias in the drawings are only illustrative and are not intended to limit the scope of the present invention. The method of embedding a magnetic component was described in U.S. patent application Ser. No. 12/699,777, which is entitled "Packaged structure having magnetic component and method thereof", which is hereby incorporated by reference in its entirety.

The "ring type" structure is not limited to a round or an oval ring, and may also be a square ring, a polygon ring or any other rings having suitable shapes. Unless otherwise specified, the singular forms of "a" and "the" adopted in the specification and the claims cover the plural meanings.

In the above embodiments, the ring type magnetic component is embedded for example. However, it should be understood that the method of the present invention is applicable to embedding an electronic component having any other shapes (e.g. H shape or strip shape) or any other types of electronic components, and the shape and depth of the region of the component accommodation trench may be defined accordingly. In addition, the present invention is not limited to the above specific process and sequence of the processes, and any other process or sequence of the processes may be adopted without departing the spirit and scope of the present invention.

Although the present invention has been disclosed with reference to the above embodiments, these embodiments are not intended to limit the present invention. It will be apparent to those skilled in the art that various modifications and variations can be made without departing from the scope or spirit of the present invention. Therefore, the scope of the present invention shall be defined by the appended claims.

What is claimed is:

1. A method of embedding a magnetic component in a substrate, the method comprising:
    forming two holes spaced at a predetermined distance in a substrate by a first removing technique, wherein each of the two holes has a top opening, a bottom and a sidewall, and an area of the top opening of each of the two holes is larger than that of the bottom thereof, and the sidewall extends downwards a predetermined depth from the top opening, and then is slanted inwardly to the bottom, thereby forming a sloped sidewall at the bottom of each of the two holes;
    removing completely a portion of the substrate between the two holes to connect the two holes to each other as a component accommodation trench by a second removing technique such that a portion of the sidewall and a portion of the sloped sidewall of each of the two holes is reserved to be treated as a portion of the component accommodation trench; and
    placing a magnetic component into the component accommodation trench;
    wherein a removing rate of the second removing technique is greater than that of the first removing technique.

2. The method of claim 1, wherein the first removing technique for forming two holes is performed by mechanically drilling.

3. The method of claim 1, wherein the second removing technique for removing the portion of the substrate between the two holes is performed by punching or routing.

4. The method of claim 1, further comprising filling an adhesive substance in the component accommodation trench.

5. The method of claim 1, further comprising:
    forming a dielectric layer on the substrate;
    forming a metal layer on the dielectric layer; and
    forming a through hole penetrating through the substrate.

* * * * *